(12) United States Patent
Woo et al.

(10) Patent No.: US 9,230,610 B2
(45) Date of Patent: Jan. 5, 2016

(54) SEMICONDUCTOR MEMORY DEVICE FOR USE IN MULTI-CHIP PACKAGE

(71) Applicant: Samsung Electronics Co., Ltd., Suwon-si (KR)

(72) Inventors: Mi-Young Woo, Seongnam-si (KR); Myong-Jae Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/336,689

(22) Filed: Jul. 21, 2014

(65) Prior Publication Data

US 2015/0162068 A1    Jun. 11, 2015

(30) Foreign Application Priority Data

Dec. 9, 2013   (KR) .................. 10-2013-0152499

(51) Int. Cl.
  G11C 7/00      (2006.01)
  G11C 5/02      (2006.01)
  G11C 11/406    (2006.01)
  G11C 8/12      (2006.01)
  G11C 29/44     (2006.01)

(52) U.S. Cl.
  CPC ........ G11C 5/025 (2013.01); G11C 8/12 (2013.01); G11C 11/40615 (2013.01); G11C 11/40618 (2013.01); G11C 2029/4402 (2013.01)

(58) Field of Classification Search
  USPC .................................. 365/222, 194, 227
  See application file for complete search history.

(56) References Cited

U.S. PATENT DOCUMENTS

| | | | |
|---|---|---|---|
| 5,798,976 A | 8/1998 | Arimoto | |
| 5,999,471 A | 12/1999 | Choi | |
| 6,563,756 B2 | 5/2003 | Kim | |
| 7,145,827 B2 | 12/2006 | Kwak et al. | |
| 7,535,785 B2 | 5/2009 | Kim | |
| 7,929,369 B2 | 4/2011 | Lee et al. | |
| 8,244,971 B2 | 8/2012 | Rajan et al. | |
| 2004/0093461 A1 | 5/2004 | Kim | |
| 2006/0233012 A1 | 10/2006 | Sekiguchi et al. | |
| 2011/0007594 A1 | 1/2011 | Kim | |
| 2011/0087835 A1* | 4/2011 | Sato et al. | 711/106 |
| 2014/0355370 A1* | 12/2014 | Kim | 365/222 |

FOREIGN PATENT DOCUMENTS

| | | |
|---|---|---|
| JP | 2006-277870 A | 10/2006 |
| KR | 10-2005-0118526 A | 12/2005 |

* cited by examiner

*Primary Examiner* — Vu Le
(74) *Attorney, Agent, or Firm* — Muir Patent Law, PLLC

(57) ABSTRACT

Provides is a multi-chip package including a plurality of semiconductor memory devices. Each of semiconductor memory devices includes a register and a control circuit. The register is configured to store start sequence information representing start of execution of a refresh operation in the multi-chip package. The control circuit is configured to control start of the execution of the refresh operation in response to the start sequence information stored in the register. Since the start of the execution of the refresh operation is performed in sequence of respective semiconductor memory devices according to the start sequence information stored in the register, consumption of peak current may be reduced in a power saving mode.

16 Claims, 19 Drawing Sheets

SEMICONDUCTOR MEMORY DEVICE FOR USE IN MULTI-CHIP PACKAGE

CROSS-REFERENCE TO RELATED APPLICATIONS

This U.S. non-provisional patent application claims priority under 35 USC §119 to Korean Patent Application No. 10-2013-0152499, filed on Dec. 9, 2013, the entirety of which is hereby incorporated by reference.

BACKGROUND OF THE INVENTION

Embodiments of the present disclosure relate to semiconductor memory devices and, more particularly, to a semiconductor memory device for suitable use in a multi-chip package where a plurality of semiconductor memory devices are integrated in a single package.

When a plurality of semiconductor chips constitute a multi-chip package together with or independently of a processor, a portable device including the multi-chip package may be miniaturized or its operating performance may be enhanced.

With the advance in portable devices, semiconductor memory devices such as DRAMs typically tend to be integrated in a multi-chip package such as a dual die package (hereinafter referred to as "DDP") or a quad die package (hereinafter referred to as "QDP"), not in a single-chip package.

A predetermined operation, e.g., refresh operation may be performed in semiconductor memory devices that are present in a multi-chip package. Peak current of the multi-chip package may increase when self-refresh operations of the semiconductor memory devices are performed at the same time.

In general, set makers of portable devices give preference to multi-chip packages including a low power or peak current consumption during a self-refresh operation.

SUMMARY OF THE INVENTION

The present disclosure provides a semiconductor memory device and a multi-chip package.

Embodiments of the disclosure provide a semiconductor memory device which may include a register configured to store start sequence information representing start of execution of a refresh operation in a multi-chip package; and a control circuit configured to control start of the execution of the refresh operation in response to the start sequence information stored in the register. The control circuit may include a refresh control circuit configured to delay start of the execution of the self-refresh operation in response to the start sequence information.

In exemplary embodiments, four semiconductor memory devices may be mounted on the multi-chip package. Each of the semiconductor memory devices may store independent start sequence information in the register.

In exemplary embodiments, the refresh operation may include a self-refresh operation executed according to a self-refresh signal.

In exemplary embodiments, the semiconductor memory device may be a dynamic random access memory (DRAM).

In exemplary embodiments, the self-refresh operation may be executed in a standby operation mode.

In exemplary embodiments, the start sequence information may be permanently stored in the register by programming electrical fuses (e-fuses).

In exemplary embodiments, the start sequence information may be stored in the register by applying a mode register set signal.

In exemplary embodiments, the refresh control circuit may include a delay adjuster configured to differentiate start of the execution of the self-refresh operation in response to a value of the start sequence information.

In exemplary embodiments, the delay adjuster may internally include a plurality of delay units for delay adjustment.

Embodiments of the disclosure provide a multi-chip package which may include a substrate; and a plurality of semiconductor memory chips stacked on a top or bottom surface of the substrate. Each of the semiconductor memory chips may include a register configured to store start sequence information for initiating execution of a refresh operation in the multi-chip package; and a control circuit configured to differentially control start of execution of the refresh operation according to the start sequence information stored in the register.

In exemplary embodiments, the multi-chip package may be a quad-die package (QDP) or a dual die package (DDP).

In exemplary embodiments, the semiconductor memory is a dynamic random access memory (DRAM), and the refresh operation may be an auto-refresh operation or a self-refresh operation.

In exemplary embodiments, the start sequence information may be stored in the register by programming electrical fuses (e-fuses).

In exemplary embodiments, the start sequence information may be stored in the register by applying a mode register set signal during an initialization operation of the multi-chip package.

In exemplary embodiments, the start sequence information may be information for reducing peak current of the multi-chip package.

Embodiments of the disclosure provide a method for a refresh operation of a multi-chip package including a plurality of semiconductor memory devices each having different chip identification information. The method may include receiving a refresh command from an outside of the multi-chip package; and for each semiconductor memory device, performing a refresh operation based on the refresh command. The performing the refresh operation may start at different times for each semiconductor memory device in response to the respective chip identification information.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
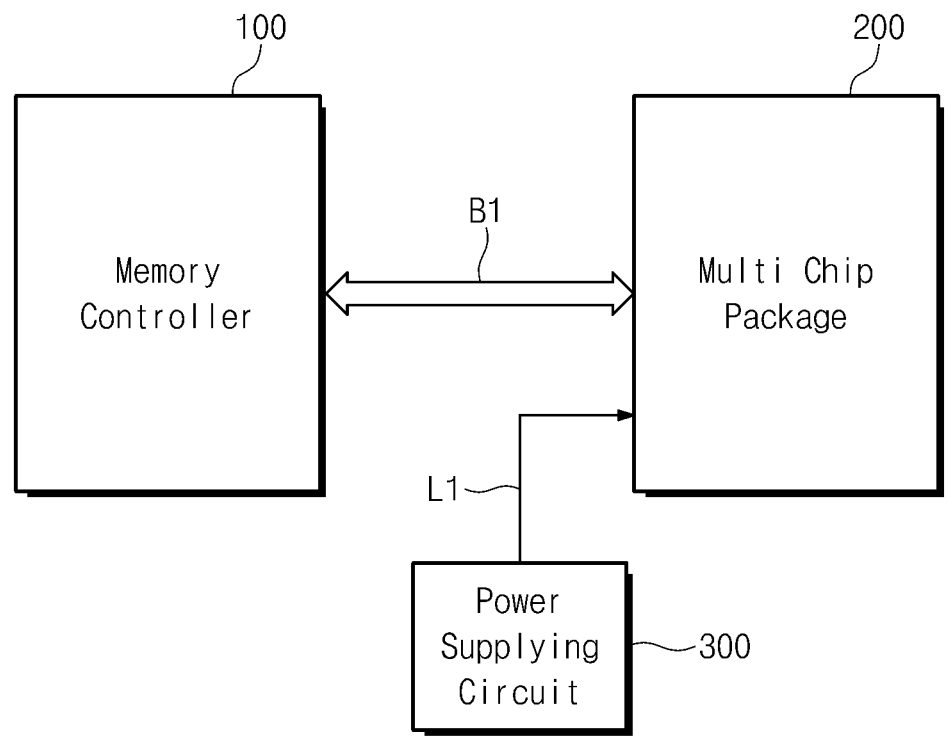
FIG. 1 is a block diagram of a memory system according to example embodiments.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. Similarly, it will also be understood that when an element is referred to as being "on" another element, it can be directly on the other element, or intervening elements may also be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. The same reference numerals or the same reference designators denote the same elements throughout the specification.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment and the details of basic data access operations (including read and write operations), a pre-charge operation, a refresh operation, and an internal function circuit on a DRAM are not described in order not to make the subject matter of the disclosure ambiguous.

FIG. 1 is a block diagram of a memory system according to example embodiments. As illustrated, the memory system includes a memory controller 100, a multi-chip package 200, and a power supplying circuit 300.

The memory controller 100 transmits a command, an address, and data to the multi-chip package 200 through a bus B1. The bus B1 also serves to apply data or a strobe signal output from the multi-chip package 200 to the memory controller 100.

If the power supplying circuit 300 is mounted inside the memory system, the power supplying circuit 300 receives external power and converts the external power to an internal power of the memory system. The internal power may be applied to the multi-chip package 200 through a line L1. The memory system in FIG. 1 is merely an exemplary configuration, and the multi-chip package 200 may directly receive the external power.

The multi-chip package 200 may be implemented as, for example, a QDP or a DDP. In such a case, peak current may increase when self-refresh operations are simultaneously performed on all chips.

The multi-chip package 200 may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 2:
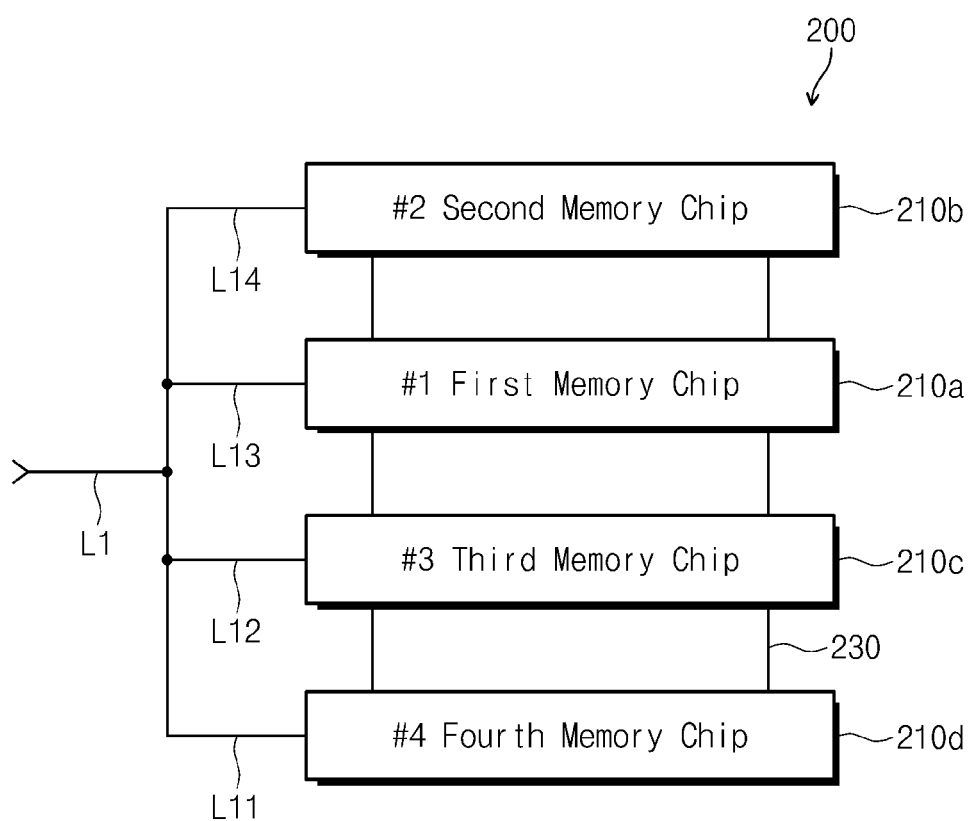
FIG. 2 is a configuration block diagram of a multi-chip package in FIG. 1 according to example embodiments.
Figure 3:
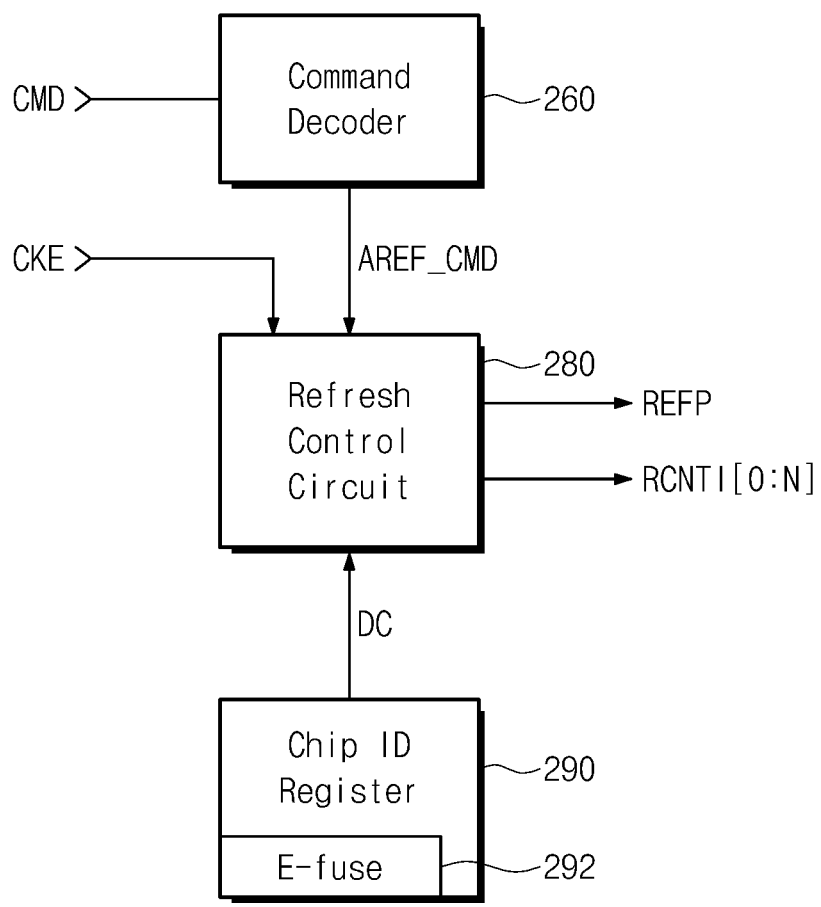
FIG. 3 is an exemplary partial block diagram of a semiconductor memory device, such as a memory chip such as shown in FIG. 2 according to one embodiment.
Figure 4:
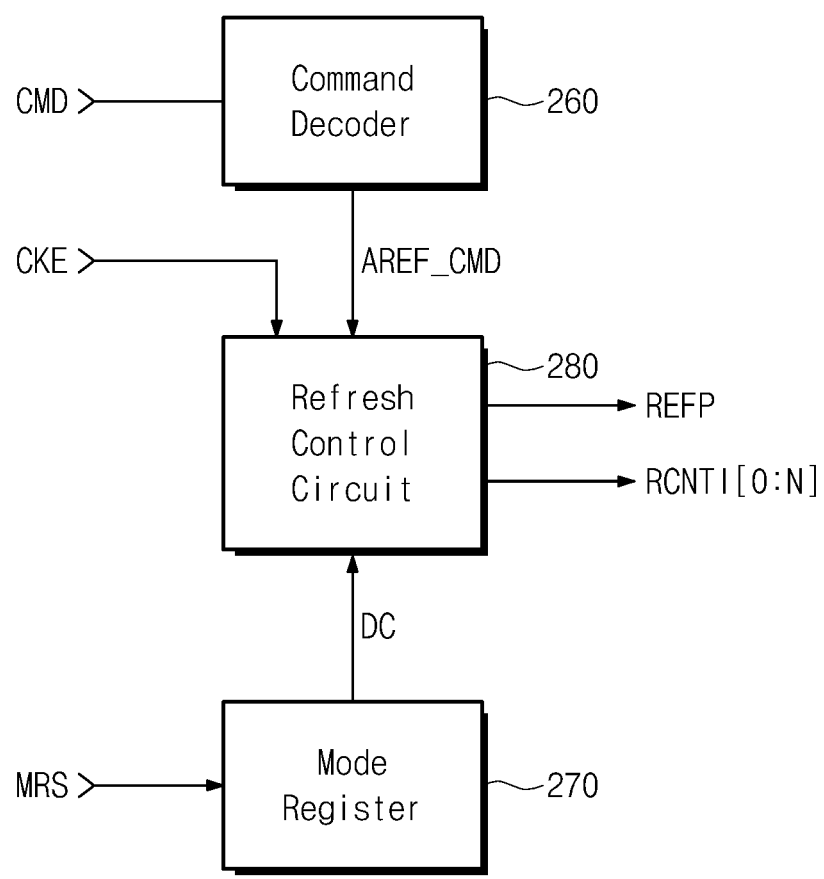
FIG. 4 is another exemplary partial block diagram of a memory chip in FIG. 2 according to one embodiment.

Accordingly, in example embodiments, circuit blocks shown in FIG. 3 or 4 are prepared in respective chips of the multi-chip package shown in FIG. 2 to minimize or decrease peak current. The circuit blocks shown in FIG. 3 or 4 allows respective chips to sequentially operate for decreasing peak current during a predetermined operation such as a self-refresh operation.

FIG. 2 is a configuration block diagram of the multi-chip package 200 in FIG. 1 according to example embodiments. As illustrated, the multi-chip package 200 includes, for example, four chips which include a first memory chip 210a, a second memory chip 210b, a third memory chip 210c, and a fourth memory chip 210d.

The first memory chip 210a and the third memory chip 210c may be mounted on an upper portion and a lower portion of a substrate, respectively.

In this specification, a single memory chip may mean a single semiconductor memory device having predetermined memory capacity, e.g., 1 gigabyte or 4 gigabytes. For example, a single memory chip may be a piece cut from a wafer. A single memory chip may be a die, that can connect to other memory chips and/or a package substrate to form a semiconductor package.

A power line L13 of the first memory chip 210a may receive power through the line L1 in FIG. 1.

A power line L14 of the second memory chip 210b may receive power through the line L1 in FIG. 1, and a power line L12 of the third memory chip 210c may receive power through the line L1 in FIG. 1. A power line L11 of the fourth memory chip 210d may receive power through the line L1 in FIG. 1.

It will be understood that since the power lines L11 to L14 are commonly connected to the line L1, peak current may increase when the first to fourth memory chips 210a to 210d operate at the same time. Thus, in some embodiments, the first to fourth memory chips 210a to 210d have chip identification information, for example, start sequence information in their registers. The start sequence information indicates a sequence of executing a predetermined operation in a multi-chip package when the operation is executed on a semiconductor memory device. For example, assuming that the first to fourth memory chips 210a to 210d have information 1, information 2, information 3, and information 4 respectively, a self-refresh operation starts from the first memory chip 210a. After predetermined time passes, the second memory chip 210b starts to execute a self-refresh operation. Thereafter, the third memory chip 210c and the fourth memory chip 210d sequentially start to execute self-refresh operations. These self-refresh operations may be simultaneously terminated in the first to fourth memory chips 210a to 210d. As such, although starts of self-refresh operations are sequentially done in units of respective chips to reduce a peak current from increasing, terminations of the self-refresh operations may be simultaneously done in the multi-chip package.

Each of the first to fourth memory chips 210a to 210d may include a register configured to store respective start sequence information. Each of the first to fourth memory chips 210a to 210d may include a control circuit configured to control the start of operation execution according to the start sequence information stored in the register.

FIG. 3 is an exemplary partial block diagram of a semiconductor memory device, such as a memory chip such as shown in FIG. 2, according to one embodiment.

Referring to FIG. 3, a command decoder 260, a refresh control circuit 280, and a chip ID register 290 constitute some blocks of the memory chip.

The command decoder 260 decodes an applied command CMD. When the command CMD is an auto-refresh command, the command decoder 260 may output an auto-refresh command AREF_CMD as a result of the decoding.

The chip ID register 290 may function as the register and store chip identification information such as start sequence information. If the chip ID register 290 includes an electrical fuse (e-fuse) 292, the start sequence information may be permanently recorded by programming the e-fuse 292. For example, in case of a second chip in the multi-chip package 200, the information (e.g., data) "01" may be stored by electrically blowing the e-fuse 292. Since the information "01" corresponds to the start sequence information and may be used as information to delay the counting of a refresh operation, the information "01" may be described as a delay counting signal DC in this specification.

The refresh control circuit 280 receives the auto-refresh command AREF_CMD and a clock enable signal CKE. The refresh control circuit 280 also receives the delay counting signal DC, which is the start sequence information, from the chip ID register 290.

Figure 5:
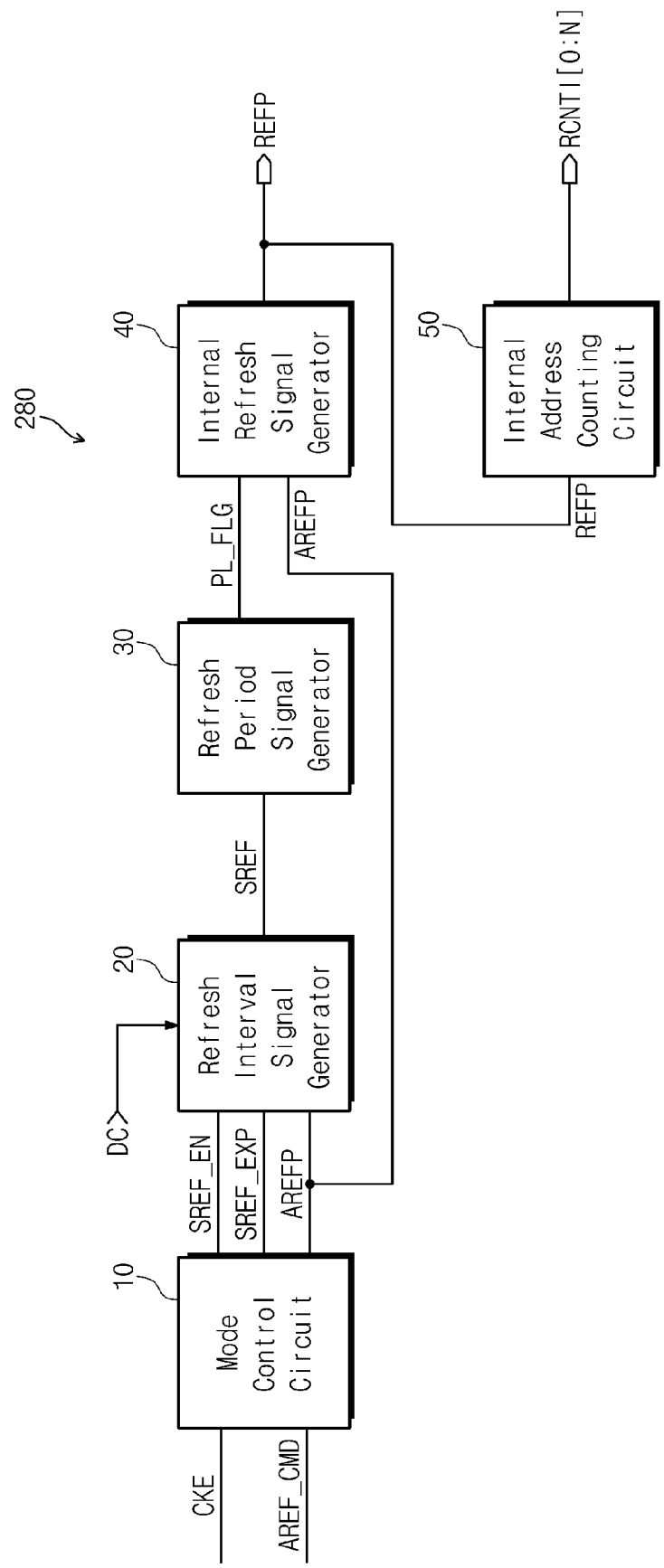
FIG. 5 is an exemplary circuit configuration diagram of a refresh control circuit in FIG. 3 or 4 according to one embodiment.

In one embodiment, the refresh control circuit 280 generates an internal refresh signal REFP and an internal address counting signal RCNTI[0:N] to control the execution of a refresh operation through circuit blocks shown in FIG. 5.

FIG. 4 is another exemplary partial block diagram of a memory chip in FIG. 2 according to one embodiment. The configuration in FIG. 4 is identical to the configuration in FIG. 3, except that the chip ID register 290 in FIG. 3 is replaced with a mode register 270.

It may be substantially impossible to change the delay counting signal DC that is the start sequence information stored in the chip ID register 290 in FIG. 3. For example, since blowing of an e-fuse is nonvolatile, for example, register information programmed to "01" cannot be changed to "10". Accordingly, a semiconductor memory chip having register information stored as "01" in this example would always operate secondarily. In contrast, the mode register 270 in FIG. 4 may have variable register information to avoid fixed operation execution. For example, when a mode register set signal MRS is applied during power-up of the multi-chip package 200, the register information may vary depending on the applied mode register set signal MRS. Thus, an arbitrary memory chip operating primarily in an operation mode before current power-up may operate secondarily in a current operation mode. For example, a memory controller may change and apply the mode register set signal MRS to a corresponding semiconductor memory chip.

A refresh control circuit 280 receives an auto-refresh command AREF_CMD and a clock enable signal CKE. The refresh control circuit 280 also receives a delay counting signal, which is start sequence information, from the mode register 270.

In each power-up mode, the refresh control circuit 280 may variably generate an internal refresh signal REFP and an internal address counting signal RCNTI[0:N] to control the execution of a refresh operation according to information of a delay counting signal DC.

In a DRAM, data is stored in the form of charge on a cell capacitor and the stored charge may be lost due to leakage current or the like. Therefore, it is customary to perform a process of periodically sensing and amplifying stored data and rewriting the amplified data before the data is completely erased. This process is typically called a refresh operation.

A refresh operation may be classified into an auto-refresh operation and a self-refresh operation. The auto-refresh operation is performed by externally applying an auto-refresh command AR at regular time intervals. On the other hand, the self-refresh operation is one of various operation modes of a semiconductor memory device and is used to reduce power consumption. In case of the self-refresh operation, a specific command is not provided to a semiconductor memory device in an external chipset such as a memory controller. For example, in this operation mode, only a self-refresh entry condition is provided by changing a logic state or the like of a clock enable signal. Then, the semiconductor memory device performs self-refresh by itself depending on the operation of an internal counter before reaching a self-refresh exit condition. During a self-refresh operation performed in a low power mode (e.g., power saving mode), circuit blocks unassociated with a self-refresh operation such as an input buffer and a delay locked loop (DLL) are turned off to minimize power consumption. For example, in case of an application (AP) of a mobile device, the specification prescribes that output peak current is equal to or less than 20 mA in a low power (LP) mode.

FIG. 5 is an exemplary circuit configuration diagram of the refresh control circuit 280 in FIG. 3 or 4 according to one embodiment. As illustrated, the refresh control circuit 280 includes a mode control circuit 10, a refresh interval signal generator 20, a refresh period signal generator 30, an internal refresh signal generator 40, and an internal address counting circuit 50.

The mode control circuit 10 receives a clock enable signal CKE and an auto-refresh command AREF_CMD to generate an internal auto-refresh signal AREFP, a self-refresh entry signal SRFE_EN, and a self-refresh exit signal SREF_EXP. The clock enable signal CKE indicates whether a clock to synchronize driving of a semiconductor memory device is valid. Accordingly, when only the clock enable signal CKE is disabled, the semiconductor memory device enters a power-down mode or a power saving mode to minimize its power consumption.

The refresh interval signal generator 20 receives the internal auto-refresh signal AREFP, the self-refresh entry signal SREF_EN, the self-refresh exit signal SREF_EXP, and the start sequence information (delay counting signal DC) to generate a self-refresh signal SREF notifying a start of executing a self-refresh operation.

The refresh period signal generator 30 periodically outputs a period-pulse signal PL_FLG during the enabling of the self-refresh signal SREF.

The internal refresh signal generator 40 enables an internal refresh signal REFP in response to the internal auto-refresh signal AREFP and the period-pulse signal PL_FLG. For example, the internal refresh signal REFP may control a start of enabling of a word line or bit line sense amplifier of each of the semiconductor memory devices to reduce a peak current.

The internal address counting circuit 50 increases a row address in units of one bit and outputs the increased row address as an internal address RCNTI[0:N] in response to the internal refresh signal REFP. As such, for each semiconductor memory device, the internal address counting circuit 50 may start execution of an internal address counting operation at different times.

Figure 6:
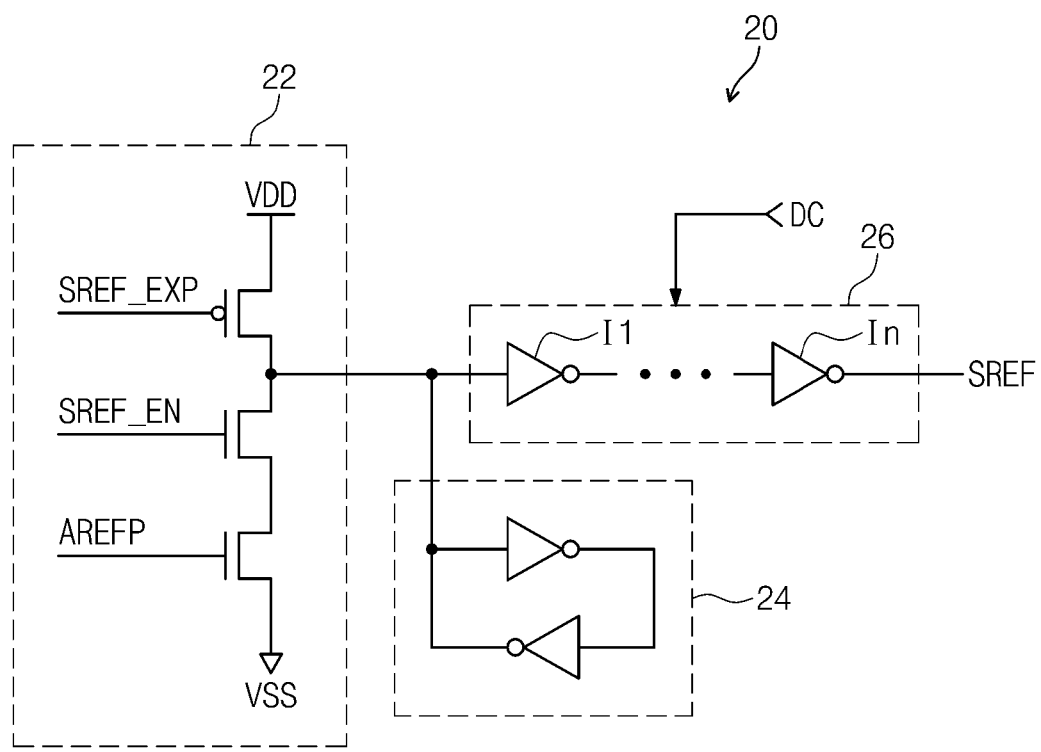
FIG. 6 is an exemplary circuit configuration diagram of a refresh period signal generator in FIG. 5 according to one embodiment.

FIG. 6 is an exemplary circuit configuration diagram of the refresh period signal generator 20 in FIG. 5 according to one embodiment. As illustrated, the refresh period signal generator 20 includes a signal generator 22 to enable an output signal of the signal generator 22 during the enabling of the self-refresh entry signal SREF_EN and the internal auto-refresh signal AREFP and to disable an output signal of the signal generator 22 during the enabling of the self-refresh exit signal SREF_EXP, a latch 24 to latch an output signal of the signal generator 22, and a delay adjuster 26 to delay the output signal of the signal generator 22 according to the delay counting signal DC and to output the delayed output signal as a self-refresh signal SREF.

The delay adjuster 26 serves to differentiate a delay in start of the self-refresh operation by using the self-refresh signal SREF in response to a value of the start sequence information (e.g., delay counting signal DC).

The signal generator 22 outputs a logic 'L' level when both the self-refresh entry signal SREF_EN and the internal auto-refresh signal AREFP become a logic 'H' level. The latch 24 latches the output signal of a logic 'L' level of the signal generator 22. For example, the delay adjuster 26 allows the self-refresh signal SREF to be output after passing through only an inverter I1 when a value of the delay counting signal DC is 00 and allows the self-refresh signal SREF to be output after passing through only three inverters I1, I2, and I3 when a value of the delay counting signal DC is 01.

When the self-refresh signal SREF is output through odd inverters, the self-refresh signal SREF is enabled to a logic 'H' level. However, this is merely exemplary and the self-refresh signal SREF may pass through even inverters to obtain an output of logic 'L' level.

On the other hand, when the self-refresh exit signal SREF_EXP is enabled to a logic 'L' level, the signal generator 22 disables an output signal to a logic 'H' level. The latch 24 latches the output signal of the signal generator 22, and the self-refresh signal SREF is disabled by the delay adjuster 26.

In one embodiment, the refresh interval signal generator 20 enables the self-refresh signal SREF after the enabling of the self-refresh entry signal SREF_EN and the internal auto-refresh signal AREFP. This enabled self-refresh signal is maintained before the self-refresh exit signal SREF_EXP is enabled. Afterwards, the self-refresh signal SREF is disabled when the self-refresh exit signal SREF_EXP is enabled.

Figure 7:
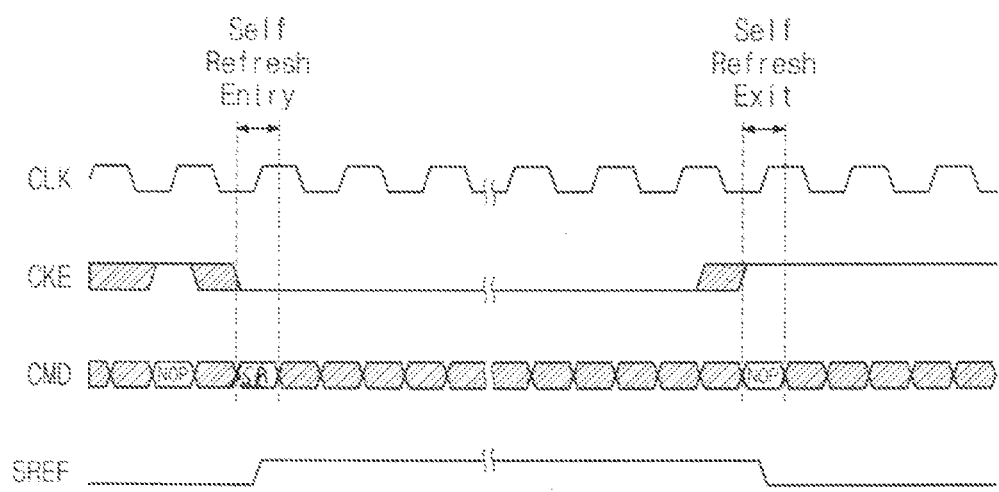
FIG. 7 is an exemplary operation timing diagram in FIG. 5.

FIG. 7 is an exemplary operation timing diagram in FIG. 5. In FIG. 7, operation timing of generating the self-refresh execution signal SREF in FIG. 5 is exemplarily shown.

When a clock enable signal CKE transitions to a logic 1' level while an auto-refresh command AREF_CMD is enabled, the mode control circuit 10 enables the self-refresh entry signal SREF_EN. The refresh interval signal generator 20 enables the self-refresh execution signal SREF in response to the internal auto-refresh signal AREFP and the self-refresh entry signal SREF_EN. This enabling of the self-refresh execution signal SREF is maintained until self-refresh execution signals SREF1 to SREF4 become low.

Figure 8:
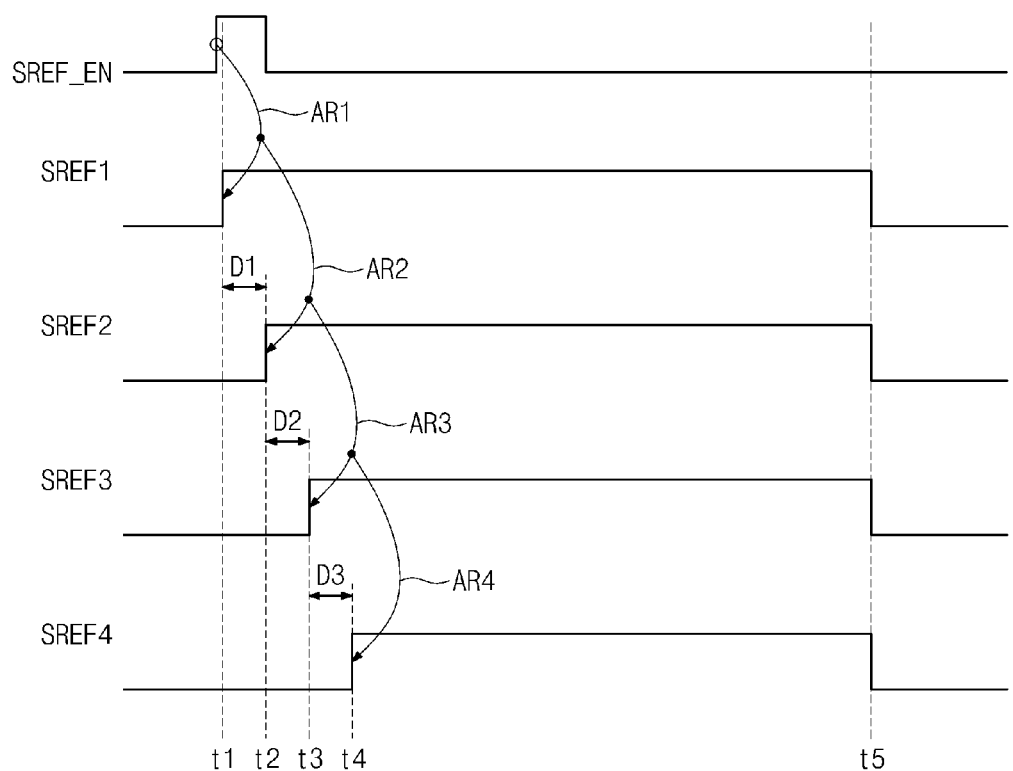
FIG. 8 is a self-refresh operation timing diagram applied to FIG. 2 according to example embodiments.

FIG. 8 is a self-refresh operation timing diagram applied to FIG. 2 according to one embodiment. In FIG. 8, a self-refresh entry signal SREF_EN and self-refresh execution signals SREF1 to SREF4 are shown.

When the self-refresh entry signal SREF_EN is generated from the mode control circuit 10 in FIG. 5, the refresh interval signal generator 20 may generate one of the self-refresh execution signals SREF1 to SREF4 according to information of the delay counting signal DC.

Accordingly, as indicated by an arrow AR1, a self-refresh operation of the first memory chip 210a in FIG. 2 may start at timing t1 and, as indicated by an arrow AR2, a self-refresh operation of the second memory chip 210b in FIG. 2 may start at timing point t2 that is delayed by D1 from the timing t1. In addition, as indicated by an arrow AR3, a self-refresh operation of the third memory chip 210c in FIG. 3 may start at timing t3 that is delayed by D2 from the timing t2 and, as indicated by an arrow AR4, a self-refresh operation of the fourth memory chip 210d may start at timing t4 that is delayed by D3 from the timing t3. In one embodiment, all the self-refresh execution signals SREF1 to SREF4 may be disabled at the same time t5 based on enabling the self-refresh exit signal SREF_EXP.

Accordingly, since self-refresh operations are sequentially performed in units of memory chips, a peak current value appearing on a line L1 may be reduced as compared to a case where all memory chips start a self-refresh operation at the same time.

Figure 9:
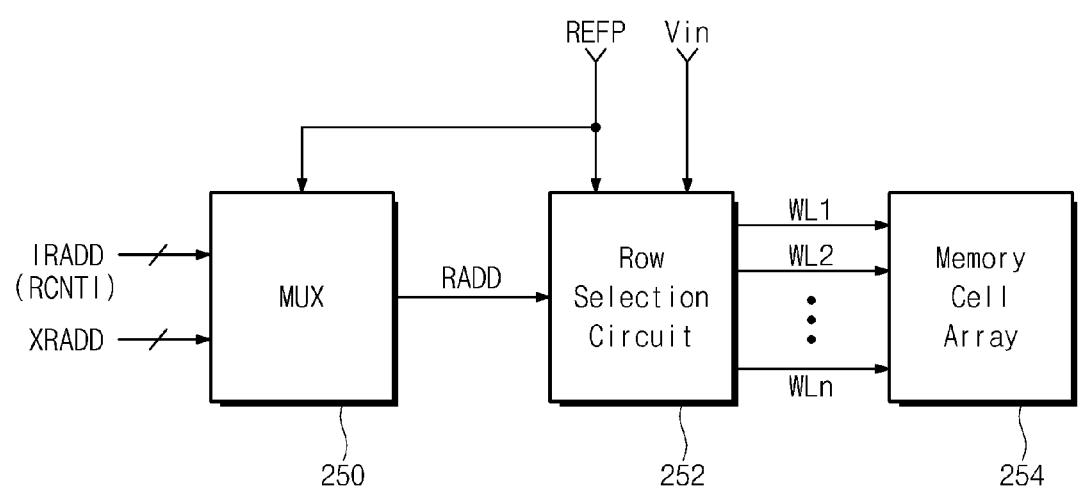
FIG. 9 is an exemplary circuit block diagram of a semiconductor memory device connected to FIG. 5 according to one embodiment.

FIG. 9 is an exemplary circuit block diagram of a semiconductor memory device connected to FIG. 5 according to one embodiment. FIG. 9 shows a connection configuration of row selection to refresh memory cells of a memory cell array 254.

A reference term IRADD indicates the internal address counting signal RCNTI[0:N], which is provided to a one-side input of a multiplexer 250. The multiplexer 250 selects one of the IRADD and an external row address XRADD and outputs the selected one as a row address RADD. When the enabled internal refresh signal REFP is applied to the multiplexer 250 as a selection signal, the multiplexer 250 outputs the IRADD as the row address RADD.

A row selection circuit 252 decodes the row address RADD such that a high driving voltage Vin is applied to a selected word line. A selected one of word lines WL1 to WLn of a memory cell array 254 is activated to refresh data stored in memory cells connected to the selected word line.

The row selection circuit 252 performs a row selection operation for executing a refresh operation in response to the internal refresh signal REFP. The row selection circuit 252 may include a row decoder and a word line driver. For example, the selected word lines of each of the semiconductor memory devices may be enabled at different times, respectively. Accordingly, a peak current of the multi-chip package can be reduced.

A row decoder connected to the memory cell array 254 decodes a row address to enable a selected one of a plurality of word lines.

A sense amplifier (e.g., a bit line sense amplifier) connected to a bit line intersecting the word line detects a potential appearing on a bit line of a selected memory cell to sense data stored in the selected memory cell. After data sensing is completed, the sensed data is restored in a corresponding memory cell during a self-refresh operation. For example, a bit line sense amplifier may also be controlled by the internal refresh signal REFP to differentiate start time of execution of the bit line sense amplifier operation. The bit line sense amplifiers of each of the semiconductor memory devices are enabled at different times, respectively. Accordingly, a peak current of the multi-chip package can be reduced.

Figure 10:
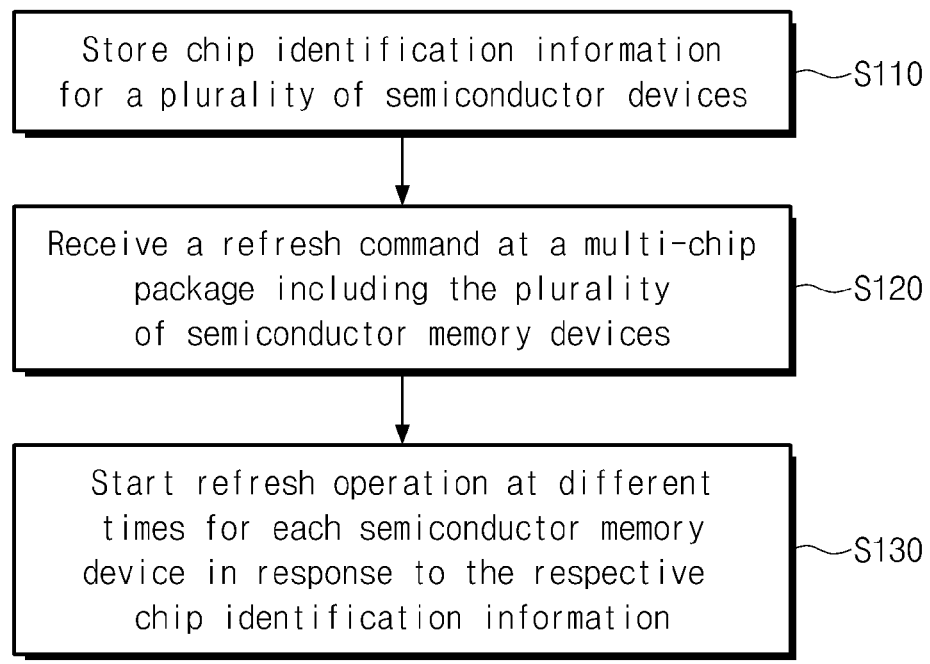
FIG. 10 is a flowchart illustrating a method for a refresh operation of a multi-chip package in FIG. 1 according to example embodiments.

FIG. 10 is a flowchart illustrating a method 100 for a refresh operation of a multi-chip package in FIG. 1 according to example embodiments. Referring to FIG. 10, chip information for a plurality of semiconductor devices may be stored (step S110). For example, each of the semiconductor memory devices may include chip identification information such as '00' to '11'. In one embodiment, the chip identification information may be stored in a chip ID register (e.g., a fuse circuit) or a mode register of each semiconductor memory device as shown FIGS. 3 and 4. For example, when the chip identification information is stored in a fuse circuit, the storing operation may be processed during a manufacturing of the semiconductor memory device. On the other hand, when the chip identification information is stored in a mode register, the storing operation may be processed when the multi-chip package is operating (e.g., power-up). For example, the respective chip identification information may be received from an outside of the multi-chip package and stored in the mode register of each of the semiconductor memory devices.

In step S120, a refresh command is received at a multi-chip package including a plurality of semiconductor memory devices (e.g., chips) stacked on each other. Next, when a refresh operation (e.g., a self-refresh operation) is performed based on the refresh command, the refresh operation may start at different times for each semiconductor memory device in response to the respective chip identification information (step S130). In one embodiment, the self-refresh operation of each of the semiconductor memory devices may be finished at the same time. The self-refresh operation of each of the semiconductor memory devices may be controlled by a refresh control circuit of FIG. 5, which delays a start of the self-refresh operation in response to the respective chip identification information. The refresh operation of each of the semiconductor memory devices may include enabling a word line or a bit line sense amplifier at different times for each semiconductor memory device.

Figure 11:
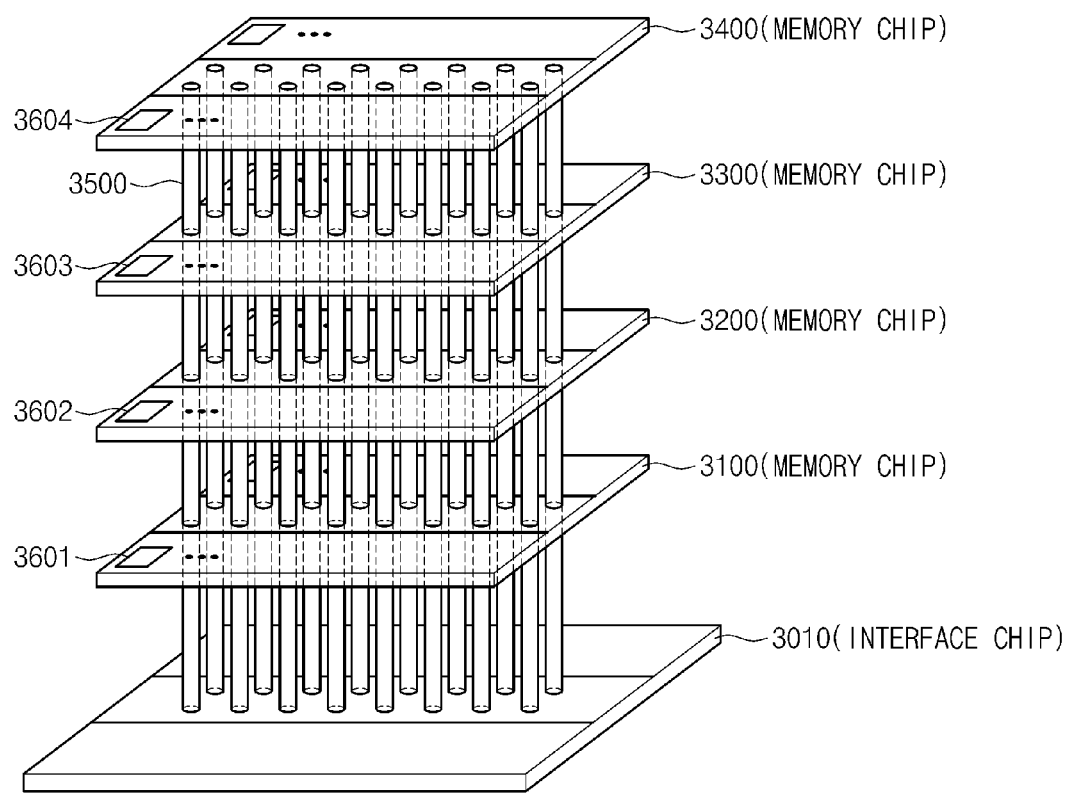
FIG. 11 illustrates a memory system including semiconductor memory devices stacked each other through TSV according to certain embodiments.

FIG. 11 illustrates a memory system including semiconductor memory devices stacked on each other through a through substrate via (e.g., a through silicon via (TSV)) according to certain embodiments. Referring to FIG. 11, an interface chip 3010 is disposed at a lowermost layer and memory chips 3100, 3200, 3300, and 3400 are disposed thereon. The memory chips 3100, 3200, 3300, and 3400 may include sensing and storage circuits 3601, 3602, 3603, and 3604, respectively. A micro bump (uBump) (not shown) may connect between one chip and another chip. The respective chips may be connected through TSVs 3500. For example, one or more chips may be stacked.

In case of FIG. 11, the memory chips 3100, 3200, 3300, and 3400 may be implemented using the multi-chip package 200 shown in FIG. 1. Since the memory chips 3100, 3200, 3300, and 3400 operate with their inherent delays during a refresh operation, peak current of a multi-chip package decreases.

Figure 12:
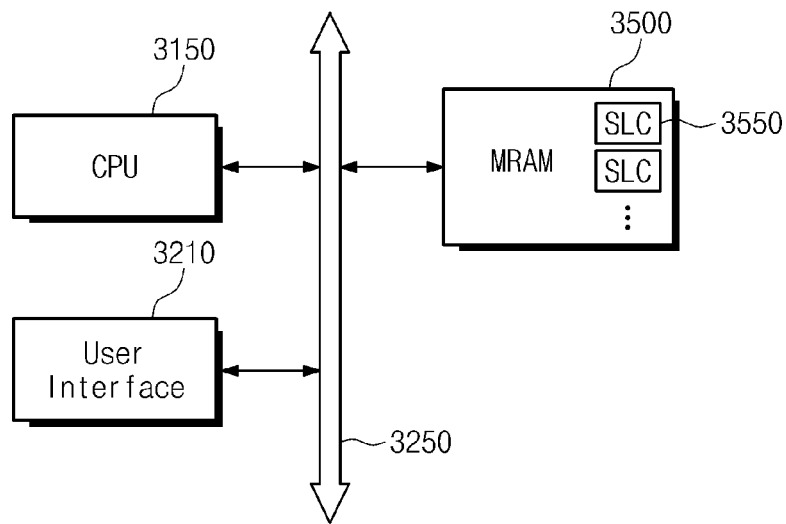
FIG. 12 illustrates an electronic system according to certain embodiments.

FIG. 12 illustrates an electronic system according to certain embodiments. As illustrated, an MRAM 3500 including a data read circuit 3550, a central processing unit (CPU) 3150, and a user interface are connected through a system bus 3250. The MRAM 3500 may be implemented using a multi-chip package such as the multi-chip package 200 shown in FIG. 1.

If the electronic system is a portable electronic device, a separate interface may be connected to an external communication device. The communication device may be a digital versatile disc (DVD) player, a computer, a set top box, a game player, a digital camcorder or the like.

A chip of the MRAM 3500 or a chip of the CPU 3150 may be packaged independently or together as one of various types to be subsequently embedded. For example, a chip may be packaged by one of PoP (Package on Package), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In FIG. 12, a flash memory may be further employed in the bus 3250. However, various types of nonvolatile storages may be used without limitation thereto.

The nonvolatile storage may store data information having various data formats such as texts, graphics, and software codes.

Even in the case of FIG. 12, a chip of the MRAM 3500 may be implemented as a part of a multi-chip page. Thus, since an operation in a predetermined mode is performed with a delay equivalent to a delay set in a power saving mode, peak current consumed may be reduced or minimized.

Figure 13:
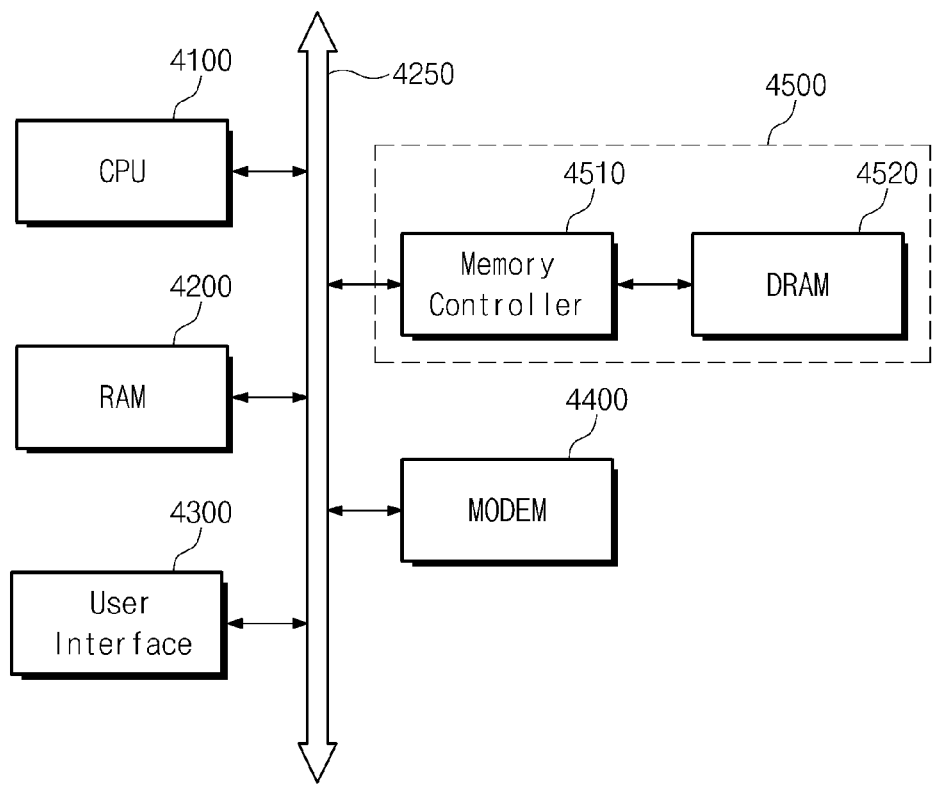
FIG. 13 is a block diagram illustrating a computing device according to certain embodiments.

FIG. 13 is a block diagram illustrating a computing device according to certain embodiments. As illustrated, the computing device may include a memory system 4500 including a DRAM 4520 and a memory controller 4510. The computing device may include an information processing device, a computer or the like. In some embodiments, the computing device may include a memory system 4500 and a modem 4400, a CPU, a RAM 4200, and a user interface 4300 that are electrically connected to a system bus 4250. Data processed by the CPU 4100 or externally input data may be stored in the memory system 4500.

The computing device may be applied to a solid state disk (SSD), a camera image sensor, and other application chipsets. In some embodiments, the memory system 4500 may be configured with an SSD. In this case, the computing device may stably and reliably large-capacity data in the memory system 4500.

Since the DRAM 4520 constituting the memory system 4500 may be implemented using a multi-chip package such as shown in FIG. 1, peak current consumption characteristics of the computing device may be enhanced.

The memory controller 4510 may apply a command, an address, data or other control signals to the DRAM 4520 channel-independently.

The CPU 4100 functions as a host and controls the overall operation of the computing device.

A host interface between the CPU 4100 and the memory controller 4150 may include various protocols for data exchange between a host and the memory controller 4500. In exemplary embodiments, memory controller 4510 may be configured to communicate with a host or an external device through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

The computing device shown in FIG. 13 may be applied as one of a computer, an Ultra Mobile PC (UMPC), a digital picture player, a digital video recorder, a digital video player, a storage constituting a data center, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

Even in the case of FIG. 13, the DRAM 4520 may function as a part of a multi-chip package and thus a predetermined operation may be performed at predetermined timing.

Figure 14:
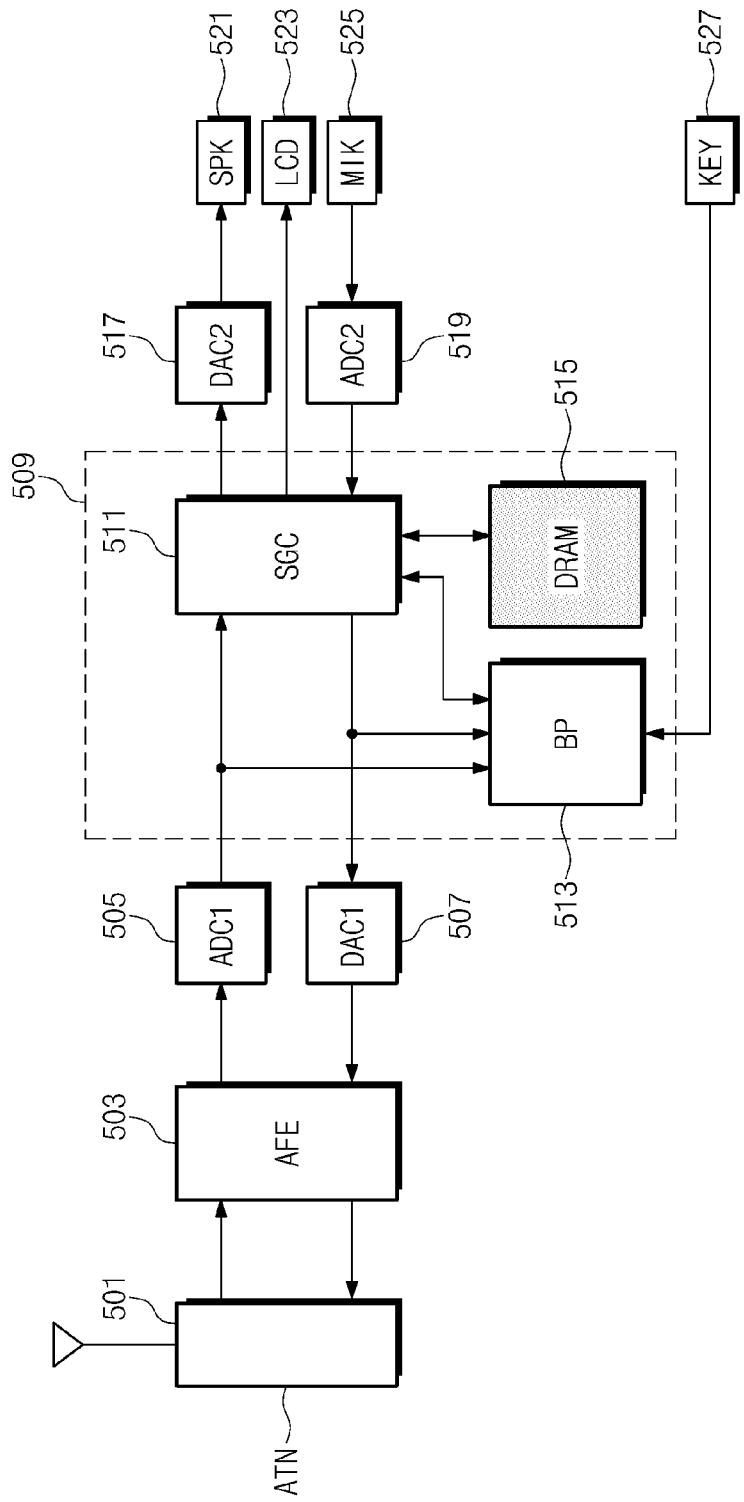
FIG. 14 is a block diagram illustrating a smart phone according to certain embodiments.

FIG. 14 is a block diagram illustrating a smart phone according to certain embodiments. In FIG. 14, a block diagram of main parts of a mobile phone such as a DRAM-incorporated smartphone is shown. As illustrated, a smartphone may include an antenna (ATN) 501, an analog front-end block (AFE) 503, analog-digital converter circuits (ADC1 and ADC2) 505, digital-analog converter circuits (DAC1 and DAC2) 507, a baseband block (BBD) 509, a speaker (SPK) 521, a liquid crystal monitor (LCD) 523, a microphone (MIK) 525, and an input key (KEY) 527. Although omitted in this figure, an analog front-end block 503 is a circuit block which includes an antenna switch, a bandpass filter, various amplifiers, a power amplifier, a phase-locked loop (PLL), a voltage control oscillator (VCO), a quadrature demodulator, and a quadrature modulator and performs transmission and reception of radio waves. The baseband block 509 may include a signal processing circuit (SGC) 511 and a baseband processor (BP) 513, and a DRAM 515.

The operation of the smartphone according to FIG. 14 will now be described. When an image including voice and text information is received, a radio wave input from an antenna is input to the analog-digital converter circuit (ADC1) 505 through the analog front-end block (AFE) 503 and is subjected to waveform equalization and analog-to-digital conversion. An output signal of the analog-digital converter circuit (ADC1) 505 is input to the signal processing circuit (SGC) 511 in the baseband block 509 to perform voice and image processing. A voice signal is transmitted to the speaker 521 from the digital-analog converter circuit (DAC2) 517, and an image signal is transmitted to the liquid crystal monitor 523.

When the voice signal is transmitted, a signal input from the microphone 525 is input to the signal processing circuit (SGC) 511 through the analog-digital converter circuit (ADC2) 519 to perform voice processing. An output of the signal processing circuit (SGC) 511 is transmitted to the antenna 501 from the digital-analog converter circuit (DAC1) 507 through the analog front-end block 503. When the text information is transmitted, a signal input from the input key 527 is transmitted to the antenna 501 through the baseband block 509, the digital-analog converter circuit 507, and the analog front-end block (AFE) 503.

In FIG. 14, the DRAM 515 may be implemented using a multi-chip package, for example, the multi-chip package 200 shown in FIG. 1. In such a case, the DRAM 515 may access the baseband processor 513 through a first channel and access an application processor (not shown) through a second channel. As a result, a single memory chip may be shared by two processors.

Although the DRAM 515 is mounted in FIG. 14, an MRAM is mounted instead of the DRAM 515 in other cases.

Volatile semiconductor memory devices such as SRAM and DRAM lose their stored data when their power supplies are interrupted.

In contrast, nonvolatile semiconductor memory devices such as magnetic random access memory (MRAM) retain their stored data even when their power supplies are interrupted. Thus, nonvolatile semiconductor memory devices are preferentially used to data when there is a desire to prevent data loss caused by power failure or power-off.

When a spin transfer torque magneto resistive random access memory (STT-MRAM) constitute a multi-chip package, decrease in peak current and advantages of an MRAM may be added.

An STT-MRAM cell may include a magnetic tunnel junction (MTJ) element and a selection transistor. The MTJ element may basically include a pinned layer, a free layer, and a tunnel layer disposed therebetween. A magnetization direction of the pinned layer is fixed, and a magnetization of the free layer may be identical to or revere to that of the pinned layer according to conditions.

Figure 15:
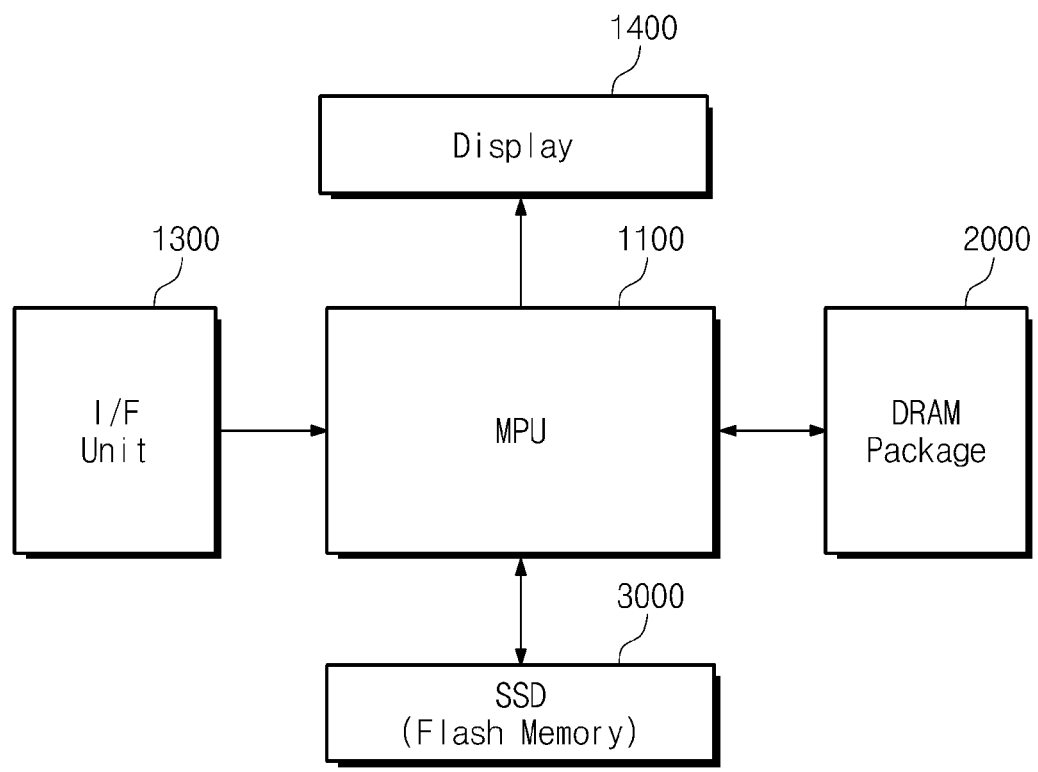
FIG. 15 is a block diagram illustrating a mobile system according to certain embodiments.

FIG. 15 is a block diagram illustrating a mobile system according to certain embodiments. As illustrated, the mobile system such as a notebook computer may include a microprocessing unit (MPU) 1100, a display 1400, an interface (I/F) unit 1300, a DRAM package 2000, and a sold-state drive (SSD) 3000.

If the mobile system is a portable communication device, a transceiver and a modem to modulate/demodulate communication data and transmit/receive the data may be connected to the interface unit 1300.

The MPU 1100 controls the overall operation of the mobile system according to a predetermined program.

The DRAM package 2000 may be connected to the MPU 1100 through a system bus and function as a buffer memory or a mina memory of the MPU 1100.

Since the DRAM package 2000 may constitute a multi-chip package 200 shown in FIG. 1, consumption of peak current may be reduced in a power saving mode.

The flash memory 3000 may be a NOR-type or NAND-type flash memory.

The display 1400 may include a touch screen as a component of a liquid crystal having backlight, a liquid crystal having an LED light source or an organic light emitting diode (OLED). The display 1400 may function as an output component to display images such as letters, numbers, and figures in color.

While the mobile system has been mainly described with respect mobile communication devices, the mobile system may function as a smart card by adding or removing its components, if necessary.

The mobile system may connect a separate interface to an external communication device. The communication device may be a digital versatile disc (DVD) player, a computer, a set top box (STB), a game player, a digital camcorder or the like.

Although not shown in the figure, it will be apparent to those skilled in the art that the mobile system may be further provided with an application chipset, a camera image processor (CIS), a mobile DRAM, and so forth.

Although FIG. 8 illustrates an example where a flash memory is employed in a mobile system, various types of nonvolatile storages may be employed.

The nonvolatile storage may store data information having various data formats such as texts, graphics, and software codes.

Figure 16:
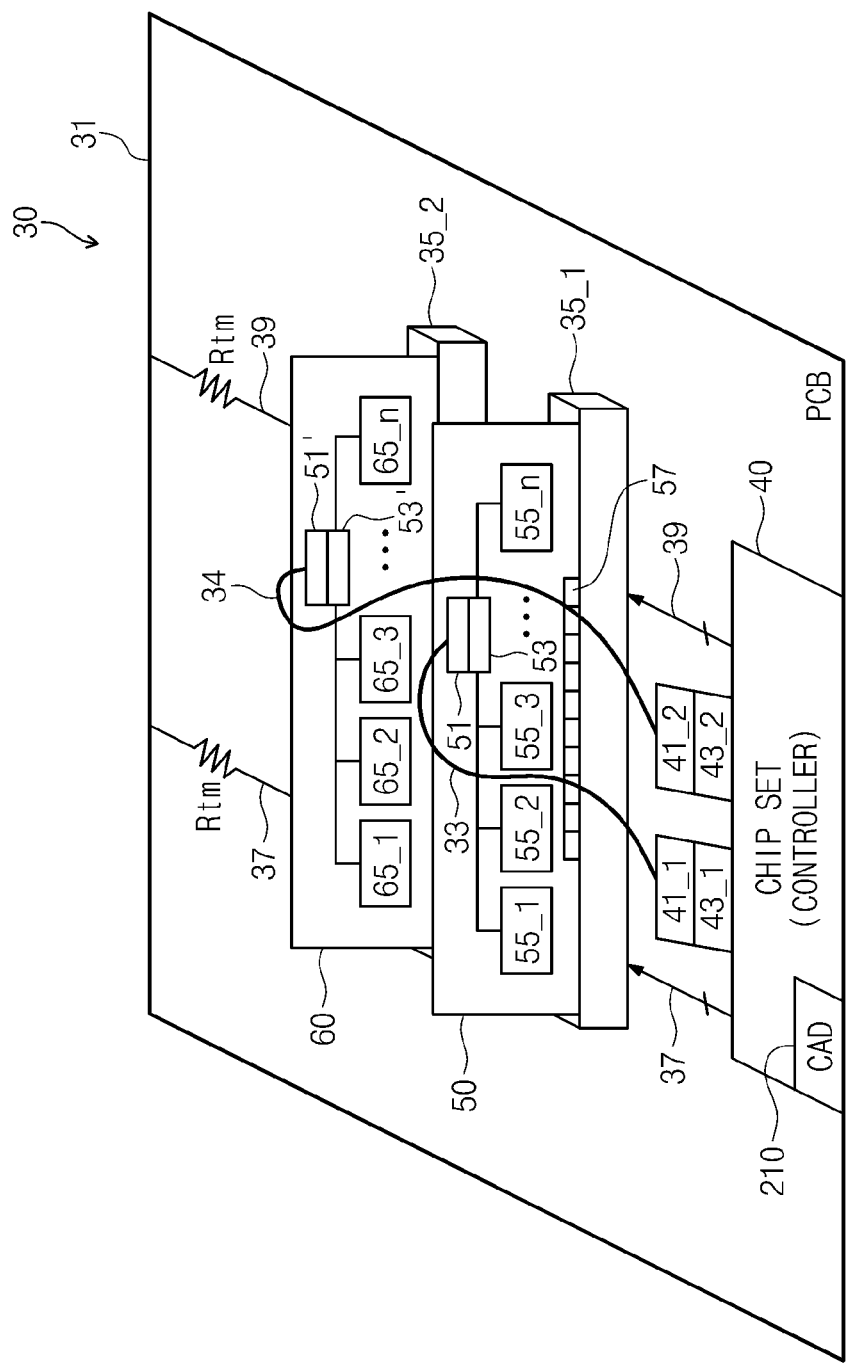
FIG. 16 is a block diagram illustrating an optical I/O schema according to certain embodiments.

FIG. 16 is a block diagram illustrating an optical I/O schema according to certain embodiments. As illustrated, a memory system 30 adopting a high-speed optical I/O includes a chipset 40 that is a controller mounted on a printed circuit board (PCB) 31 and memory modules 50 and 60. The memory modules 50 and 60 may be inserted into slots 35_1 and 35_2 installed on the PCB 31, respectively. The memory module 50 may include a connector 57, channel DRAM memories 55_1 to 55_n, an optical I/O input part 51, and an optical I/O output part 53.

The optical I/O input part 51 may include a photoelectric conversion device for converting an applied optical signal into an electrical signal, for instance, a photodiode. Thus, an electrical signal output from the photoelectric conversion device is received to the memory module 50. The optical I/O output part 53 may include a conversion device for converting an electrical signal output from the memory module 50 into an optical signal, for instance, a laser diode. If necessary, the optical I/O output part 53 may further include an optical modulator for modulating a signal output from a light source.

An optical cable 33 is in charge of an optical communication between the optical I/O input part 51 of the memory module 50 and an optical transmission part 41_1 of the chipset 40. The optical communication may have a bandwidth of several tens of gigabits per second or more. The memory module 50 may receive signals or data applied from signal lines 37 and 39 of the chipset 40 through the connector 57 and may perform a high speed data communication with the chipset 40 through the optical cable 33. Resistors Rtm installed in lines 37 and 39 are termination resistors.

In even the case of the memory system 30 adopting an optical I/O structure, the channel DRAM memories 55_1 to 55_n may be mounted in a multi-chip package such as the multi-chip package 200 shown in FIG. 1.

Accordingly, the chipset 40 may independently perform a data read operation and a data write operation for each channel.

In FIG. 16, the chipset 40 may include a concentration access detector 210 to generate a concentration access detection signal when the frequency of applying a frequently applied address is greater than a predetermined threshold value.

The chipset 40 may prevent or mitigate corruption of data retained by memory cells in adjacent memory regions adjacent to a specific memory region when the concentration access detection signal is generated.

For example, when a specific wordline, a specific bitline or a specific memory block of a volatile semiconductor memory such as DRAM is concentrically accessed, memory cell data may be corrupted. That is, memory cells of adjacent wordlines adjacent to a specific wordline, adjacent bitlines adjacent to a specific bitline or adjacent memory block adjacent to a specific memory block may lose their retained data due to concentric access of their retained data. Thus, there is a need to prevent or mitigate loss of cell data through elimination or avoidance of address concentration.

When channel DRAM memories 55_1 to 55_n of the memory modules 50 and 60 are accessed in units of memory pages, columns or banks, the concentration access detector 210 monitors access concentration.

If the memory system in FIG. 16 is an SSD, the channel DRAM memories 55_1 to 55_n may be used as a user data buffer.

Figure 17:
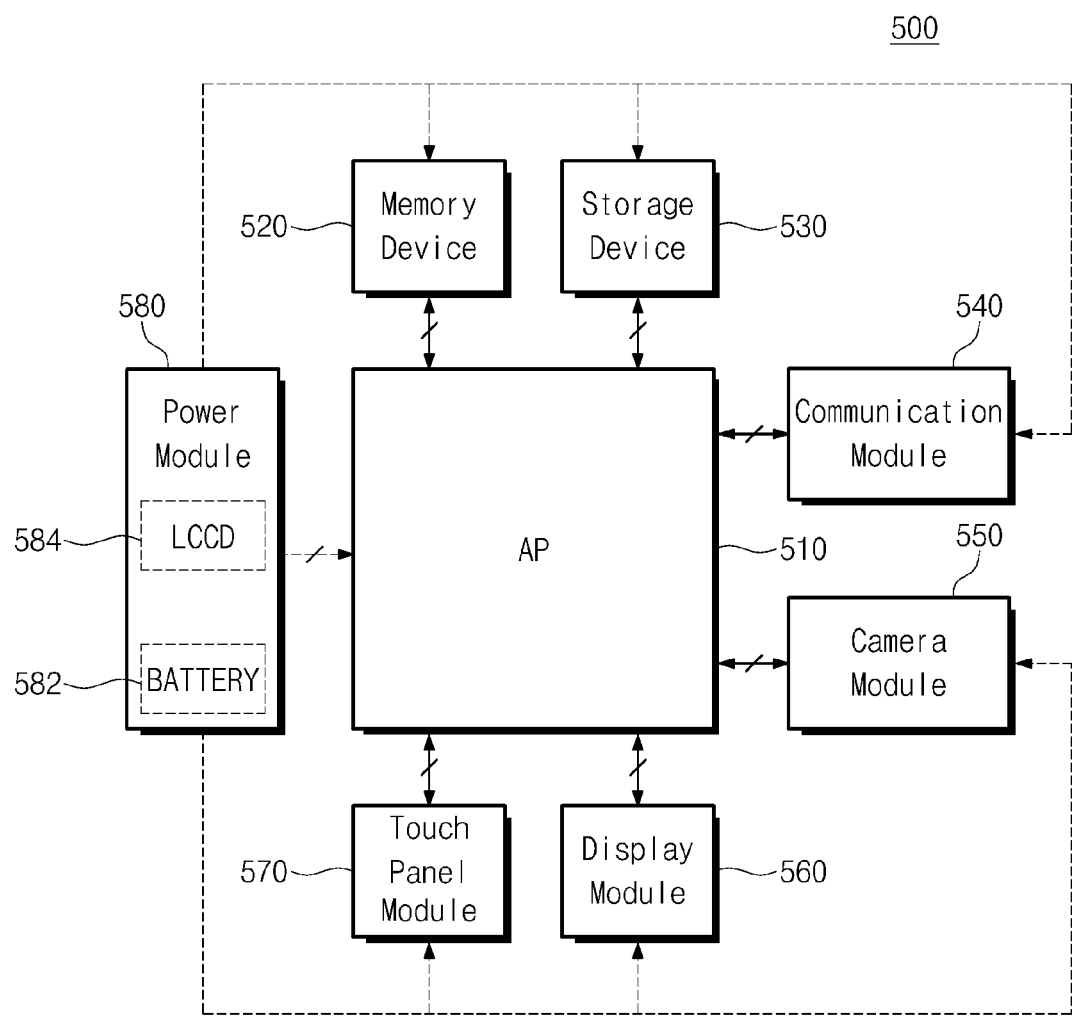
FIG. 17 is a block diagram illustrating a portable multimedia system according to certain embodiments.

FIG. 17 is a block diagram illustrating a portable multimedia system 500 according to certain embodiments. As illustrated, the portable multimedia system 500 may include an AP 510, a memory device 520, a storage device 530, a communication module 540, a camera module 550, a display module 560, a touch panel module 570, and a power module 580.

The AP 510 may perform a data processing function.

In FIG. 17, the memory device 520 may include a multi-chip package such as the multi-chip package 200 as shown in FIG. 1. Thus, since peak current consumed by the memory device 520 may be reduced during the operation of the portable multimedia system 500, performance of the multimedia system 500 may be powerful.

The communication module 540 connected to the AP 510 may function as a modem to transmit/receive communication data and modulate/demodulate the data.

The storage device 530 may be implemented as a NOR-type or NAND-type flash memory to store large-capacity information.

The display module 560 may include a touch screen as a component of a liquid crystal having backlight, a liquid crystal having an LED light source or an organic light emitting diode (OLED). The display module 560 may function as an output component to display images such as letters, numbers, and figures in color.

The touch panel module 570 may provide a touch input to the AP 510 solely or on the display module 560.

While the portable multimedia system 500 has been mainly described with respect to mobile communication devices, the portable multimedia system may function as a smart card by adding or removing its components, if necessary.

The portable multimedia system may connect a separate interface to an external communication device. The communication device may be a digital versatile disc (DVD) player, a computer, a set top box (STB), a game player, a digital camcorder or the like.

The nonvolatile storage may store data information having various data formats such as texts, graphics, and software codes.

The power module 580 performs power management of the portable multimedia system. As a result, power saving of the portable multimedia system is achieved when a PMIC scheme is applied into the portable multimedia system.

The camera module 550 includes a camera image processor (CIS) and is connected to the AP 510.

Although not shown in the figure, it will be apparent to those skilled in the art that the portable multimedia system may be further provided with another application chipset, a mobile DRAM, and so forth.

Figure 18:
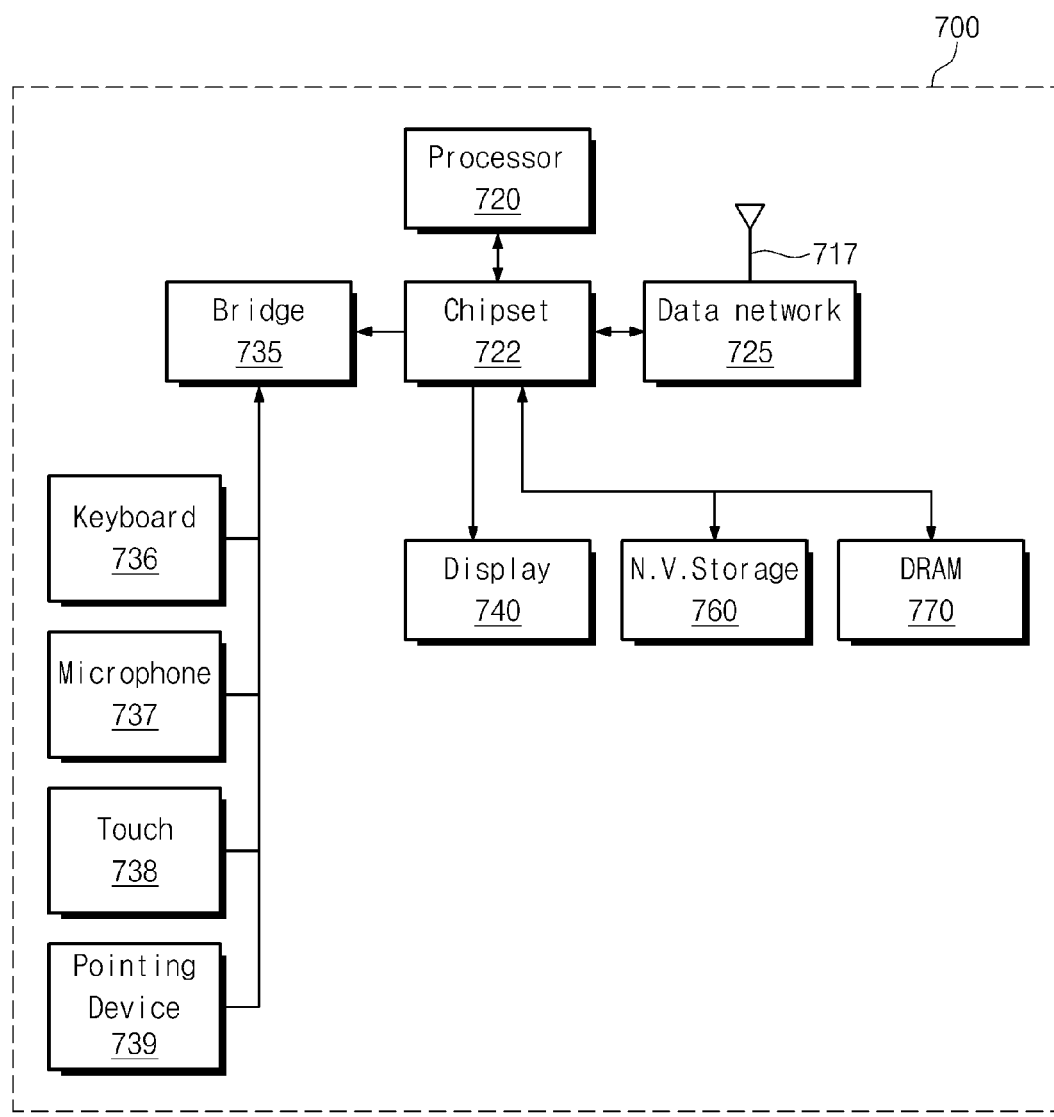
FIG. 18 is a block diagram illustrating a personal computer according to certain embodiments.

FIG. 18 is a block diagram illustrating a personal computer 700 according to certain embodiments. As illustrated, the personal computer 700 may include a processor 720, a chipset 722, a data network 725, a bridge 735, a display 740, a nonvolatile storage 760, a DRAM 770, a keyboard 736, a microphone 737, a touch unit 738, and a pointing device 739.

In FIG. 18, the DRAM 770 may function as an element in a multi-chip package such as the multi-chip package 200 as shown in FIG. 1. Thus, peak current consumed by the DRAM 770 may be reduced during the operation of the personal computer 700.

The chipset 722 may apply a command, an address, data or other control signals to the DRAM 770.

The processor 720 functions as a host and controls the overall operation of the personal computer 700.

A host interface between the processor 720 between the processor 720 and the chipset 722 includes various protocols for performing data communication.

The nonvolatile storage 760 may be implemented with an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is also called an ovonic unified memory (OUM), a resistive RAM (RRAM or ReRAM), a nanotube RRAM, a polymer RAM (PoRAM), a nano floating gate memory (NFGM), a holographic memory, a molecular electronics memory device or an insulator resistance change memory.

The personal computer shown in FIG. 18 may be applied to one of an ultra mobile PC (UMPC), a workstation, a net-book, a personal digital assistant (PDA), a web tablet, a wireless phone, a mobile phone, a smart phone, an e-book, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

Figure 19:
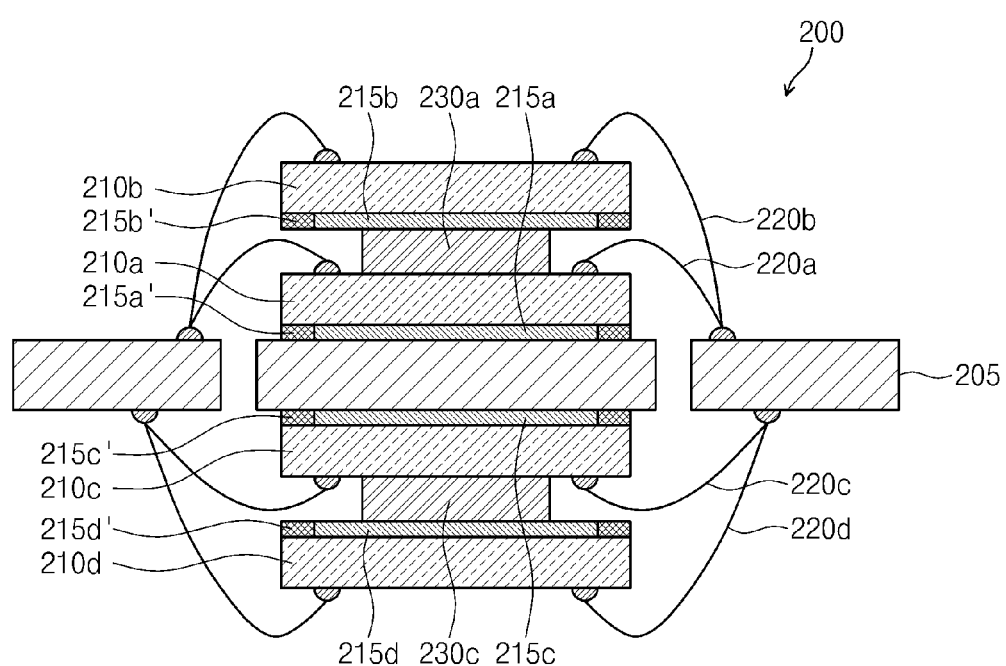
FIG. 19 is an exemplary diagram illustrating stacking implementation of the multi-chip package in FIG. 2.

FIG. 19 is an exemplary diagram illustrating stacking implementation of the multi-chip package 200 in FIG. 2.

In FIG. 19, a stacked surface of the multi-chip package is shown. An example shown in FIG. 19 is a quad-die package (QDP) where four semiconductor chips 210a, 210b, 210c, and 210d stacked on a single package substrate 205. In particular, there is shown a structure where two semiconductor chips are stacked on both surfaces of the package substrate 205, respectively. The package substrate 205 may be a printed circuit board (PCB) or a lead frame substrate.

More specifically, the two semiconductor chips 210a and 210b are stacked on one surface of the package substrate 205, and the other two semiconductor chips 210c and 210d are stacked on the other surface thereof. As shown in the figure, these semiconductor chips 210a, 210b, 210c, and 210d have the same size. For example, these semiconductor chips 210a, 210b, 210c, and 210 may be the same products.

As shown in the figure, lower semiconductor chips 210a and 210c are bonded to both surfaces of the package substrate 205 by adhesive layers 215a and 215c. Upper semiconductor chips 210b and 210d are spaced apart from the lower semiconductor chips 215a and 215c by spacer tapes 230a and 230c, respectively. Adhesive layers 215b and 215d are attached to lower ends of the upper semiconductor chips 210b and 210d to be bonded to the spacer tapes 230a and 230c, respectively. Curing parts 215a', 215b', 215c', and 215d' are provided at portions of edges of the adhesive layers 215a, 215b, 215c, and 215d bonded to lower ends of the four semiconductor chips 210a, 210b, 210c, and 210d, respectively.

Conductive wires 220a, 220b, 220c, and 220d are connected to upper portions of the four semiconductor chips 210a, 210b, 210c, and 210d from an upper portion of the package substrate 205, respectively.

Figure 20:
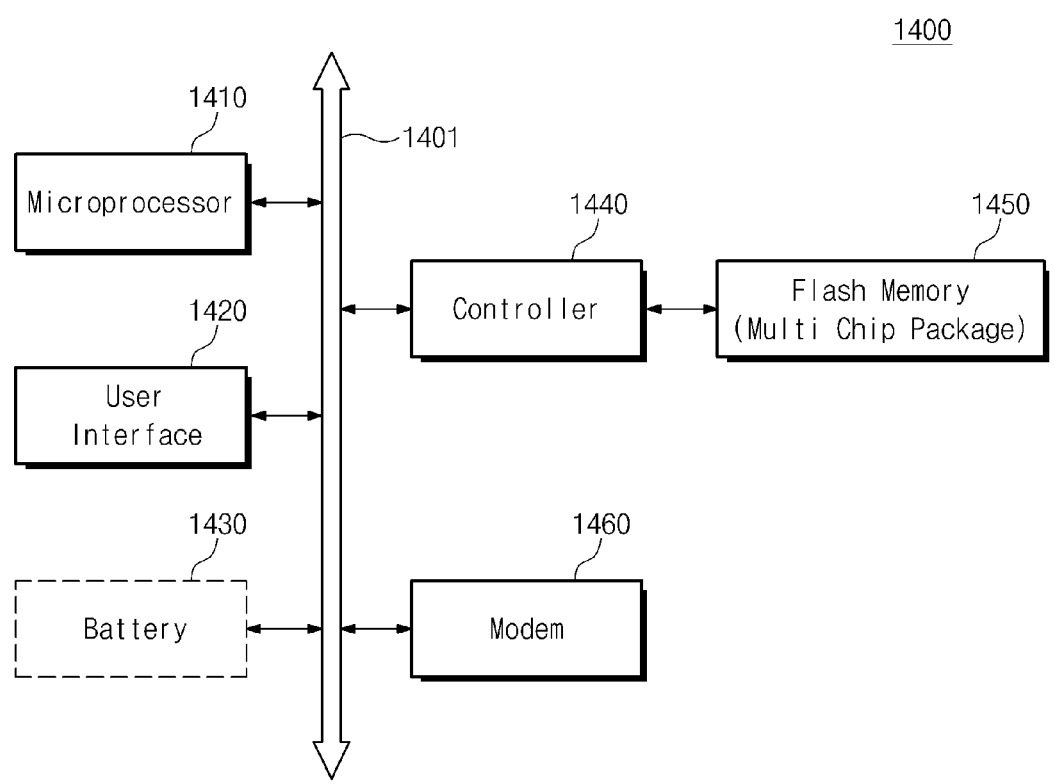
FIG. 20 is a block diagram of a computing system according to certain embodiments.

FIG. 20 is a block diagram of a computing system according to certain embodiments.

In FIG. 20, a computing system 1400 including a multi-chip package is shown. The computing system 1400 may include a microprocessor 1410, a user interface 1420, a modem 1460 such as a baseband chipset, a memory controller 1440, and a flash memory device 1450, which are electrically connected to a bus 1401. The flash memory device 1450 may include a multi-chip package shown in FIG. 1.

The flash memory device 1450 is connected to the microprocessor 1410 through the memory controller 1440.

If the computing system 1400 is a mobile system, a battery 1430 may be additionally provided to supply an operating voltage of the computing system 1400. Although not shown in the figure, it will be apparent to those skilled in the art that the computing system 1400 may be further provided with an application chipset, a camera image processor (CIS), a mobile DRAM, and so forth.

The memory controller 1440 and the flash memory device 1450 may constitute, for example, a solid state drive/disk (SSD) that uses a nonvolatile memory to store data. The memory controller 1440 and the flash memory device 1450 may be mounted on a single package.

Although the disclosure has been mainly described with respect to, for example, a QDP-type multi-chip package, the detailed implementation of operations may be made different by changing, adding, or removing the circuit configuration or arrangement in the drawings without departing from the technical spirit of the present disclosure in other cases.

In addition, although the disclosure has been mainly described with respect to a semiconductor memory device such as DRAM, the disclosure is not limited thereto and may be applied to other semiconductor memory devices.

According to the above-described embodiments, peak current consumed during a predetermined operation such as a self-refresh operation in a multi-chip package can be minimized or reduced.

While the disclosure has been particularly shown and described with reference to exemplary embodiments thereof, it will be apparent to those of ordinary skill in the art that various changes in form and detail may be made therein without departing from the spirit and scope of the disclosure, which is defined by the following claims.

What is claimed is:

1. A method for a refresh operation of a multi-chip package including a plurality of semiconductor memory devices each having different chip identification information, the method comprising:
    receiving a refresh command from an outside of the multi-chip package; and
    for each semiconductor memory device, performing a refresh operation based on the refresh command,
    wherein performing the refresh operation starts at different times for each semiconductor memory device in response to the respective chip identification information, and
    wherein the respective chip identification information is received from an outside of the multi-chip package, and the respective chip identification information is stored in a mode register or in a fuse circuit of each of the semiconductor memory devices.

2. The method of claim 1, wherein performing the refresh operation is a self-refresh operation.

3. The method of claim 2, wherein performing the self-refresh operation of each of the semiconductor memory devices is finished at the same time.

4. The method of claim 3, wherein performing the self-refresh operation of each of the semiconductor memory devices is controlled by a refresh control circuit configured to delay a start of the self-refresh operation in response to the respective chip identification information.

5. The method of claim 1, wherein performing the refresh operation includes enabling a word line or a bit line sense amplifier at different times for each semiconductor memory device.

6. A semiconductor memory device comprising:
    a register configured to store start sequence information representing start of execution of a refresh operation in a multi-chip package; and
    a control circuit configured to control start of the execution of the refresh operation in response to the start sequence information stored in the register,
    wherein the control circuit includes a refresh control circuit configured to delay start of the execution of the refresh operation in response to the start sequence information, and
    wherein the start sequence information is stored in the register by programming electrical fuses (e-fuses) or by applying a mode register set signal.

7. The semiconductor memory device of claim 6, wherein the multi-chip package includes a plurality of semiconductor memory devices stacked on each other, and
    wherein each of the semiconductor memory devices stores independent start sequence information in the register.

8. The semiconductor memory device of claim 7, wherein the refresh control circuit is configured to delay differently for different semiconductor memory devices based on the independent start sequence information.

9. The semiconductor memory device of claim 6, wherein the refresh operation includes a self-refresh operation.

10. The semiconductor memory device of claim 6, wherein the semiconductor memory device is a dynamic random access memory (DRAM).

11. The semiconductor memory device of claim 6, wherein the refresh control circuit includes a delay adjuster configured to differentiate start of the execution of the refresh operation in response to a value of the start sequence information.

12. The semiconductor memory device of claim 11, wherein the delay adjuster internally includes a plurality of delay units for delay adjustment.

13. A multi-chip package comprising:
    a substrate; and
    a plurality of semiconductor memory chips stacked on a top or bottom surface of the substrate,
    wherein each of the semiconductor memory chips comprises:
    a register configured to store start sequence information for initiating execution of a refresh operation in the multi-chip package; and
    a control circuit configured to differentially control start of execution of the refresh operation according to the start sequence information stored in the register,
    wherein the start sequence information is stored in the register by programming electrical fuses or by applying a mode register set signal during an initialization operation of the multi-chip package.

14. The multi-chip package of claim 13, wherein the multi-chip package is a dual die package (DDP) or a quad-die package (QDP).

15. The multi-chip package of claim 13, wherein the semiconductor memory is a dynamic random access memory (DRAM), and the refresh operation is an auto-refresh operation or a self-refresh operation.

16. The multi-chip package of claim 13, wherein a peak current of the multi-chip package that occurs during the refresh operation is reduced by using the start sequence information.

* * * * *